United States Patent [19]
Ipri et al.

[11] 4,104,087
[45] Aug. 1, 1978

[54] METHOD FOR FABRICATING MNOS MEMORY CIRCUITS

[75] Inventors: Alfred C. Ipri, Princeton; Doris W. Flatley, Belle Meade, both of N.J.

[73] Assignee: The United States of America as represented by the Secretary of the Air Force, Washington, D.C.

[21] Appl. No.: 785,481

[22] Filed: Apr. 7, 1977

[51] Int. Cl.² .......................................... H01L 21/265
[52] U.S. Cl. ...................................... 148/1.5; 357/44; 357/91
[58] Field of Search ........................ 357/44, 4; 148/1.5

[56] References Cited

U.S. PATENT DOCUMENTS

| | | | |
|---|---|---|---|
| 3,836,894 | 9/1974 | Cricchi | 340/173 R |
| 3,958,266 | 5/1976 | Athanas | 357/23 |
| 4,002,501 | 1/1977 | Tamura | 148/1.5 |

OTHER PUBLICATIONS

P. J. Krick, "MNOS Memory Array on . . . Inendating Substrate", IBM Tech. Discl. Bull., 15 (1972) 466.
H. Runge, "Threshold Voltage Shift . . . by Ion Implantation", Electronic Engineering, Jan. 1976, p. 41.
M. R. MacPherson, "The Adjustment of MOS . . . Threshold . . . Ion Implantation", Appl. Phys. Lett., 18, (1971) 502.

*Primary Examiner*—L. Dewayne Rutledge
*Assistant Examiner*—Upendra Roy
*Attorney, Agent, or Firm*—Joseph E. Rusz; Willard R. Matthews, Jr.

[57] ABSTRACT

MNOS memory circuit fabrication problems that result in leakage, memory device depletion mode switching and leakage paths at the edges of silicon islands are eliminated by a production process in which deposited and thermal oxides are used as a diffusion mask on the island edges, selective control of the threshold level of the memory device is achieved by ion implantation, and a thick oxide is grown on the silicon island edges to control charge injection.

1 Claim, 5 Drawing Figures

4,104,087

METHOD FOR FABRICATING MNOS MEMORY CIRCUITS

BACKGROUND OF THE INVENTION

This invention relates to semiconductor devices and circuits, and in particular to production processes used in the fabrication of MNOS memory circuits.

In the fabrication of MNOS memory circuits certain device characteristics have interfered with the functioning of the circuits. These are: charge injection at high fields on the edges of the silicon island causing high leakage; memory devices switching into a depletion mode, and residual photoresist causing paths at the edges of the silicon islands.

There currently exists, therefore, the need for improved production techniques and processes that will eliminate these undesirable characteristics. The present invention is directed toward satisfying that need.

SUMMARY OF THE INVENTION

The process of the invention comprehends depositing a layer of $S_iO_2$ over the surface of the stable and memory device islands of an MNOS memory circuit structure and then removing a portion of the $S_iO_2$ layer from the memory device island to permit ion implantation for threshold adjustment. The island top surfaces are then stripped and a strip thermal oxide layer is used as a mask while P+ diffusions are made to establish source and drain regions. The thermal oxide and remaining deposited $S_iO_2$ layers are removed and thin oxide and nitride layers are deposited and defined on the memory device island. A thick thermal oxide layer is then grown over the islands and contact electrodes are provided.

It is a principal object of the invention to provide a new and improved method of fabricating MNOS memory circuits.

It is another object of the invention to provide a method of fabricating MNOS memory circuits that are not subject to charge injection at high fields.

It is another object of the invention to provide a method of fabricating an MNOS memory circuit that is not subject to memory device depletion mode switching.

It is another object of the invention to provide a method of fabricating an MNOS memory circuit that does not have residual photoresist at the edges of the silicon islands.

These, together with other objects, features and advantages of the invention will become more readily apparent from the following detailed description when taken in conjunction with the illustrative embodiment in the accompanying drawings.

DETAILED DESCRIPTION OF THE PREFERRED METHOD OF FABRICATION

Figure 1:
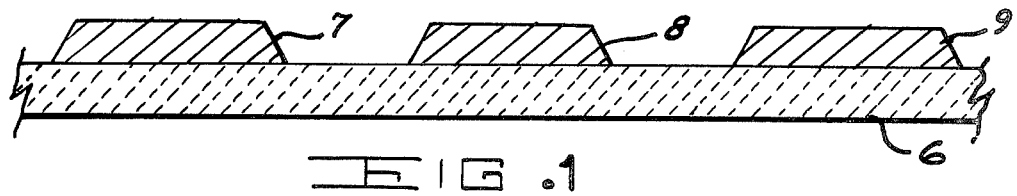
FIG. 1 is a sectional view of an MNOS memory circuit structure at the stage of fabrication represented by the first step of the method of the invention.
Figure 2:
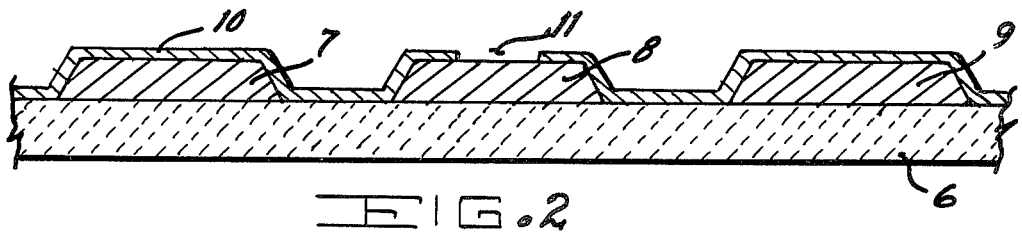
FIG. 2 is a sectional view of the MNOS memory circuit structure of FIG. 1 at the stage of fabrication represented by the fourth step of the method of the invention.
Figure 3:
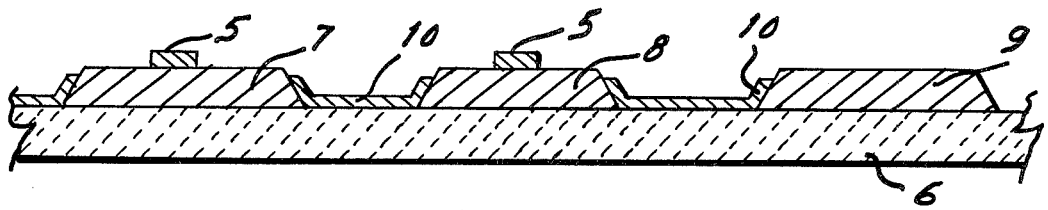
FIG. 3 is a sectional view of the MNOS memory circuit structure of FIG. 1 at the stage of fabrication represented by the eighth step of the method of the invention.
Figure 4:
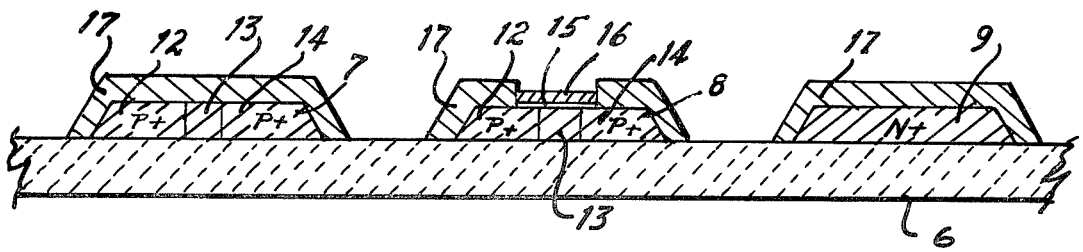
FIG. 4 is a sectional view of the MNOS memory circuit structure of FIG. 1 at the stage of fabrication represented by the fourteenth step of the method of the invention.
Figure 5:
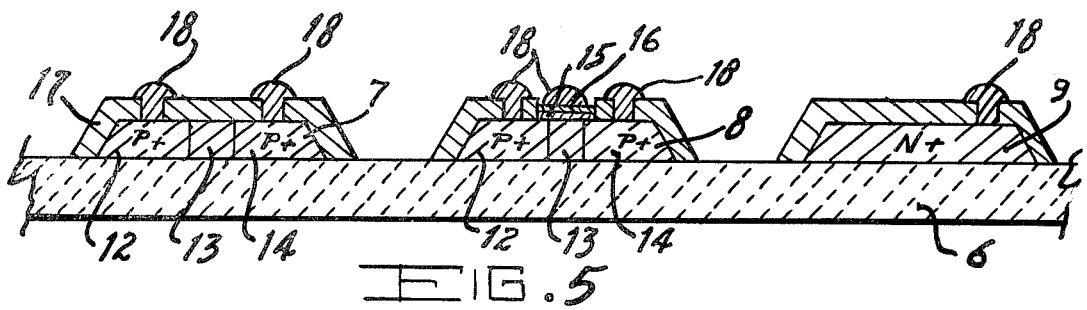
FIG. 5 is a sectional view of the MNOS memory circuit structure of FIG. 1 at its final stage of fabrication represented by the fifteenth and last step of the method of the invention.

The fabrication process of the invention is hereinafter explained with reference to FIGS. 1–5 which Figures illustrate a typical MNOS memory circuit at various stages of development. Referring now to FIG. 1, a substrate member 6 of electrically insulating material such as sapphire is provided having a smooth flat surface upon which islands or mesas 7, 8, 9 of semiconductive material are epitaxially deposited. Islands 7, 8, 9 are suitable for use as stable, memory and tunnel devices. A silicon dioxide ($S_iO_2$) layer 10 is deposited on the surface of substrate 6 and on islands 7, 8, 9 as illustrated in FIG. 2. A region 11 of the $S_iO_2$ layer is removed to define MNOS silicon nitride channel on memory device island 8. These steps and other steps in the process of the invention are of course performed in accordance with known and universally employed semiconductor device manufacturing procedures including the use of conventional photolithographic techniques. The threshold of memory device 8 is then adjusted by implanting the desired level of ions through the stripped region 11. The structure is then back exposed and $S_iO_2$ layer is stripped from the top surfaces of islands 7, 8, 9. A layer of thermal oxide is then grown on the surfaces of the stable and memory device islands. The channels 13 for stable device 7 and memory device 8 are defined and the remainder of the thermal oxide is removed to provide thermal oxide channel defining masks 5 as illustrated by FIG. 3. P+ diffusions are then performed to establish source regions 12 and drain regions 14 in stable and memory devices 7,8 and N+ diffusions are applied to tunnel device 9. The remaining oxides 5 and 10 are then stripped and a thin oxide 15 is grown on memory device 8. Nitride layer 16 is then deposited over thin oxide 15. The thin oxide 15-nitride layer 16 region shown in FIG. 4 is then defined and the surplus oxide and nitride is removed. The thick layer 17 of thermal oxide is then grown over devices 7, 8, 9 to provide the structure shown in FIG. 4. The completed structure as illustrated by FIG. 5 is accomplished by defining contact holes, metallizing and defining the metal to form contact electrodes 18.

While the invention has been described in terms of a preferred method of fabrication, it is understood that the words which have been used are words of description rather than words of limitation and that changes within the purview of the appended claims may be made without departing from the scope and spirit of the invention in its broader aspects.

What is claimed is:

1. The method of fabricating an MNOS memory circuit comprising the steps of
    fabricating semiconductor islands on a substrate member of non-conducting material to provide stable, memory and tunnel device islands,
    depositing a layer of silicon dioxide on said islands and substrate member,
    defining a MNOS silicon nitride channel region on said memory device island and removing the silicon dioxide therefrom, implanting ions into said silicon nitride channel region to a selected memory device thereshold level,
stripping the silicon dioxide layers from the top surfaces of said stable and memory device islands,
growing a thermal oxide layer over the stripped island surfaces,
defining channels on the top surfaces of said stable and memory device islands,
stripping the thermal oxide from stable and memory device island top surface areas other than areas defining said channels,
effecting P+ diffusion to said stable and memory device islands and N+ diffusion to said tunnel device island,
stripping said deposited silicon dioxide and said thermal oxide layers,
growing a thin oxide layer on the top surface of said memory device island,
depositing a layer of nitride on said layer of oxide,
defining a nitride-thin oxide region on the top surface of said memory device island and removing nitride-thin oxide from non-defined regions thereof,
growing a thick layer of thermal oxide over the surfaces and edges of said stable, memory and tunnel device islands, and
providing said stable, memory and tunnel devices with contact electrodes.

* * * * *